(12) United States Patent
Barnak et al.

(10) Patent No.: US 7,064,446 B2
(45) Date of Patent: Jun. 20, 2006

(54) UNDER BUMP METALLIZATION LAYER TO ENABLE USE OF HIGH TIN CONTENT SOLDER BUMPS

(75) Inventors: John P. Barnak, Beaverton, OR (US); Gerald B. Feldewerth, Beaverton, OR (US); Ming Fang, Portland, OR (US); Kevin J. Lee, Beaverton, OR (US); Tzuen-Luh Huang, Portland, OR (US); Harry Y. Liang, Portland, OR (US); Seshu V. Sattiraju, Portland, OR (US); Margherita Chang, Portland, OR (US); Andrew W. H. Yeoh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 114 days.

(21) Appl. No.: 10/812,464

(22) Filed: Mar. 29, 2004

(65) Prior Publication Data

US 2005/0212133 A1    Sep. 29, 2005

(51) Int. Cl.
*H01L 23/48* (2006.01)
*H01L 23/52* (2006.01)
*H01L 29/40* (2006.01)

(52) U.S. Cl. .................... 257/779; 257/780; 257/781; 257/782; 257/783

(58) Field of Classification Search ................ 257/779, 257/780, 781, 782, 783; 438/11 B
See application file for complete search history.

(56) References Cited

U.S. PATENT DOCUMENTS

| | | | |
|---|---|---|---|
| 5,234,153 A * | 8/1993 | Bacon et al. | 228/122.1 |
| 6,689,680 B1 * | 2/2004 | Greer | 438/614 |
| 6,750,133 B1 * | 6/2004 | Datta | 438/613 |
| 2004/0164421 A1 * | 8/2004 | Tellkamp | 257/772 |
| 2004/0253803 A1 * | 12/2004 | Tomono et al. | 438/614 |

* cited by examiner

*Primary Examiner*—William M. Brewster
(74) *Attorney, Agent, or Firm*—Rob G. Winkle

(57) ABSTRACT

Apparatus and methods of fabricating an under bump metallization structure including an adhesion layer abutting a conductive pad, a molybdenum-containing barrier layer abutting the adhesion layer, a wetting layer abutting the molybdenum-containing barrier layer, and high tin content solder material abutting the wetting layer. The wetting layer may be substantially subsumed in the high content solder forming an intermetallic compound layer. The molybdenum-containing barrier layer prevents the movement of tin in the high tin content solder material from migrating to dielectric layers abutting the conductive pad and potentially causing delamination and/or attacking any underlying structures, particularly copper structures, which may be present.

6 Claims, 4 Drawing Sheets

UNDER BUMP METALLIZATION LAYER TO ENABLE USE OF HIGH TIN CONTENT SOLDER BUMPS

BACKGROUND OF THE INVENTION

1. Field of the Invention

The present invention relates to microelectronic device fabrication. In particular, the present invention relates to under bump metallization layers which allow for the use for pure tin or high tin content flip-chip bumps.

2. State of the Art

The microelectronic device industry continues to see tremendous advances in technologies that permit increased circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second), to be packaged in relatively small, air-cooled microelectronic device packages. A result of such high density and high functionality in microelectronic devices has been the demand for increased numbers of external electrical connections to be present on the exterior of the microelectronic die in order to connect the microelectronic die to other components, such as an interposer.

The connection mechanism for such high density connection is generally ball grid arrays (BGAs), because the size of the balls or bumps of the array can be made smaller to provide a higher density thereof, and thereby creating a greater number of connections from microelectronic die. BGAs are formed by placing an amount of solder on a microelectronic die pad and heating the solder to a melting point. The surface tension associated with the liquid solder causes the solder to form a solder ball. The solder ball retains its shape as it cools to form a solid solder ball or bump.

As shown in FIG. 8, an exemplary microelectronic package includes a microelectronic die 402 that is mounted on a substrate 404, such as an interposer, a motherboard, and the like, which functionally connects the microelectronic die 402 through a hierarchy of electrically conductive paths (not shown) to the other electronic components (not shown). The illustrated method for electronically mounting the microelectronic die 402 to the substrate 404 is called flip chip bonding. In this mounting method, electrically conductive terminals or pads 406 on an active surface 408 of the microelectronic die 402 are attached directly to corresponding lands 412 on a surface 414 of the substrate 404 using solder bumps or balls 416, which are reflowed to from the attachment therebetween.

The material most commonly used to form solder bumps is lead/tin alloy. However, governments are requiring that the solder used to form the bumps be lead-free, as lead is, of course, known to be toxic to humans. Thus, there has been a move to remove lead from bump fabrication. Currently, substantially pure tin or high tin content alloys (90% or more tin), such as tin/bismuth, eutectic tin/sivler, ternary tin/silver/copper, eutectic tin/copper, and the like, are the most suitable material for lead-free solder bumps. The substantially pure tin or high tin content alloys are formed on an under bump metallization (UMB) (not shown) which is deposited on the microelectronic die pads 406. The UBM provides a reliable electrical and mechanical interface between the microelectronic die pads 406 and the solder bumps 416. A typical UMB for a copper-containing microelectronic die pad and a lead/tin solder ball comprises three layers: an adhesion layer for attachment to the microelectronic pad, a barrier layer over the adhesion layer to prevent contamination between the solder ball and microelectronic die, and a wetting layer between the barrier layer and the solder bump to "wet" or adhere to the solder bump material. The adhesion layer may include titanium, nickel vanadium alloy, and the like. The barrier layer may include chromium, titanium nitride, and the like. The wetting layer is usually nickel, copper, cobalt, gold, or alloys thereof.

However, the use of pure tin or high tin content alloys is problematic because tin reacts readily with under-bump metallization stacks that are commonly used in lead/tin bump processes and excessive reaction leads to bump-to-substrate delamination and/or attacks the underlying copper structures (pads and traces) during reflow, as will be understood to those skilled in the art.

The current method for solving the tin-to-under bump metallization reaction problem is to make the wetting layer very thick (e.g., >5 µm thick nickel wetting layer), such that not all of the wetting layer is consumed during the subsequent thermal stresses that the microelectronic package must endure during manufacture and while in service. However, this method is not compatible with the mechanically fragile low dielectric constant (low-k) interlayer dielectric (ILD) materials (i.e., dielectric materials with a dielectric constant below silicon dioxide), because the package-induced stresses are transferred into the hard, thick nickel material at the base of the bump and are subsequently directed into the microelectronic die. The stresses then cause low k ILD cohesive failure and/or low k ILD-to-etchstop adhesive failure.

This incompatibility with low-k ILD materials is a significant problem because, as integrated circuits have become smaller and smaller, it has become necessary to use low-k ILD materials in the fabrication thereof in order to obtain low capacitance between the interconnects. Decreasing this capacitance between the interconnects results in several advantages, including reduced RC delay, reduced power dissipation, and reduced cross-talk between the interconnects.

Therefore, it would be advantageous to develop apparatus and techniques to form an under bump metallization structure that prevents tin contamination which does not translate significant stress into structure abutting the under bump metallization.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings to which:

DETAILED DESCRIPTION OF THE ILLUSTRATED EMBODIMENT

Figure 1:
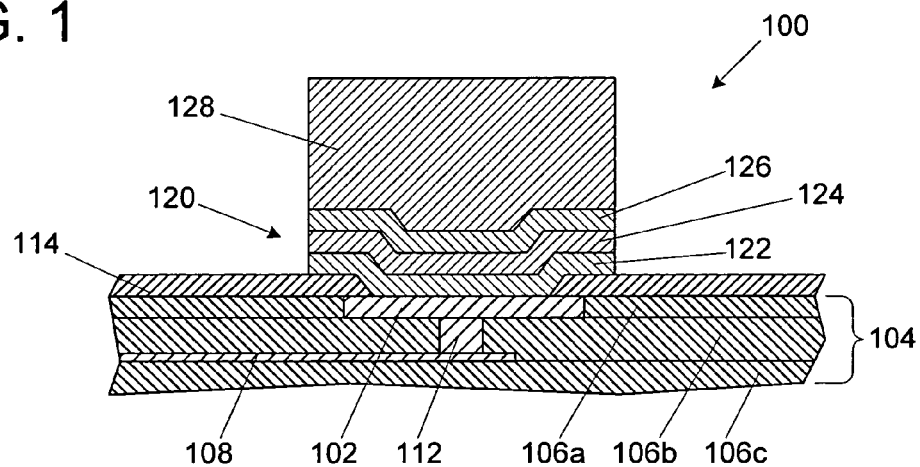
FIG. 1 is a side cross-sectional view of a metallization layer, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 illustrates a flip-chip assembly 100 including an under bump metallization structure 120 formed on a conductive pad 102. The conductive pad 102 is fabricated in or on an interconnect structure 104. The conductive pad 102 can be made of any appropriate conductive material including, but not limited to, copper, aluminum, and alloys thereof. The interconnect structure 104 may be a plurality of interlayer dielectric layers, illustrated as elements 106a, 106b, and 106c, fabricated on a microelectronic die (not shown). The interlayer dielectric layers 106a, 106b, and 106c may be fabricated from any appropriate dielectric material including, but not limited to silicon oxide, silicon nitride, and the like, as well as low-k dielectrics, such as carbon doped oxides.

The conductive pad 102 is connected to a conductive trace 108 through a conductive via 112. The conductive trace 108 is routed to the microelectronic die (not shown), as will be understood by those skilled in the art. A passivation layer 114, such as silicon nitride, may be deposited on the interconnect structure 104 and patterned to expose at least a portion of the conductive pad 102.

The under bump metallization structure 120 is fabricated to contact the conductive pad 102, by forming an adhesion layer 122, a barrier layer 124, and a wetting layer 126. The adhesion layer 122 may be formed on a portion of the passivation layer 114 and the conductive pad 102. The adhesion layer 122 is selected to adhere well to the conductive pad 102 and the passivation layer 114, and may include, but is not limited to, titanium and alloys thereof. The barrier layer 124 is formed on the adhesion layer 122 to limit the diffusion of a solder bump to be formed on the under bump metallization structure 120 to the adhesion layer 122, conductive pad 102, and interconnect structure 104 and comprises molybdenum and alloys thereof. In one embodiment, the barrier layer 124 comprises at least about 90% (atomic) molybdenum. The wetting layer 126 is formed on the barrier layer 124 to provide an easily wettable surface for the molten solder bump during assembly for good bonding of the solder to the barrier layer 124 and may include, but is not limited to, nickel, gold, copper, cobalt, and alloys thereof. The adhesion layer 122, the barrier layer 124, and the wetting layer 126 may be from by any method known in the art, including but not limited to, deposition by magnetron sputtering, evaporation, and ion beam deposition.

A solder plug 128 is formed on the wetting layer 126 and may comprise substantially pure tin or high tin content alloys, such as such as tin/bismuth, eutectic tin/sivler, ternary tin/silver/copper, eutectic tin/copper, and the like. Hereinafter, solder comprising substantially pure tin or high tin content alloy will simply be referred to as "high tin content solder". High tin content solder may be a material having at least about 75% tin by weight. In one embodiment, the solder plug 128 contains at least about 90% tin by weight. The solder plug 128 may be fabricated by any known method in the art including, but not limited to, electroplating and screen printing of a solder paste.

Figure 2:
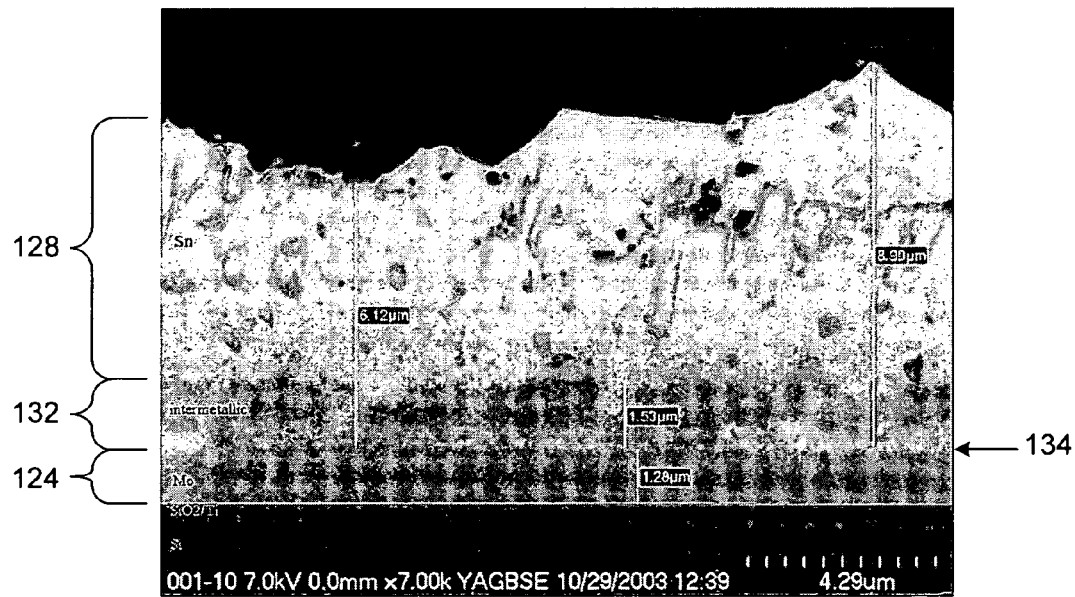
FIG. 2 is a cross-section scanning electron micrograph of a metallization layer, according to the present invention.

When the solder plug 128 is subsequently reflowed, the high tin content solder plug 128 reacts readily with the wetting layer 126 (particularly nickel, copper, cobalt, or gold containing wetting layers) and may be substantially subsumed to form an intermetallic compound layer 132. However, when the tin from the high tin content solder plug 128 contacts the molybdenum-containing barrier layer 124, the reaction with the under bump metallization structure 120 slows to almost zero. As shown in the FIG. 2, no significant voiding at the tin/molybdenum interface 134 occurs and only slight consumption of the molybdenum containing barrier layer 124 occurs once the wetting layer 126 is subsumed. As will be understood to those skilled in the art, the present invention enables the formation of a limited, cohesive intermetallic compound between molybdenum-containing barrier layer and molten tin of the solder plug during reflow. The intermetallic compound slows further diffusion of tin into the molybdenum-containing barrier layer and intermetallic compound growth. Thus, the present invention will substantially prevent the movement of tin in the high tin content solder material from migrating to dielectric layers abutting the conductive pad and potentially causing delamination and/or attacking any underlying structures, particularly copper structures, which may be present. This unique combination results in the metallization structure 120, which is compatible with a high tin content solder and is compatible with structurally weak dielectrics, such as low k ILDs.

Figure 3:
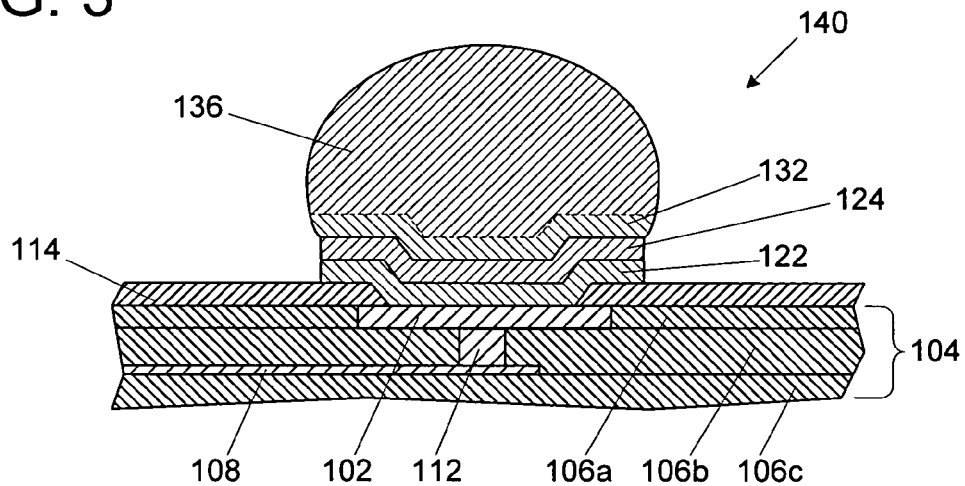
FIG. 3 is a side cross-sectional view of the metallization layer of FIG. 1 after solder reflow, according to the present invention.

FIG. 3 illustrates the flip-chip assembly 100 of FIG. 1 after reflow of the solder material 128 to form a solder bump 136.

Figure 4:
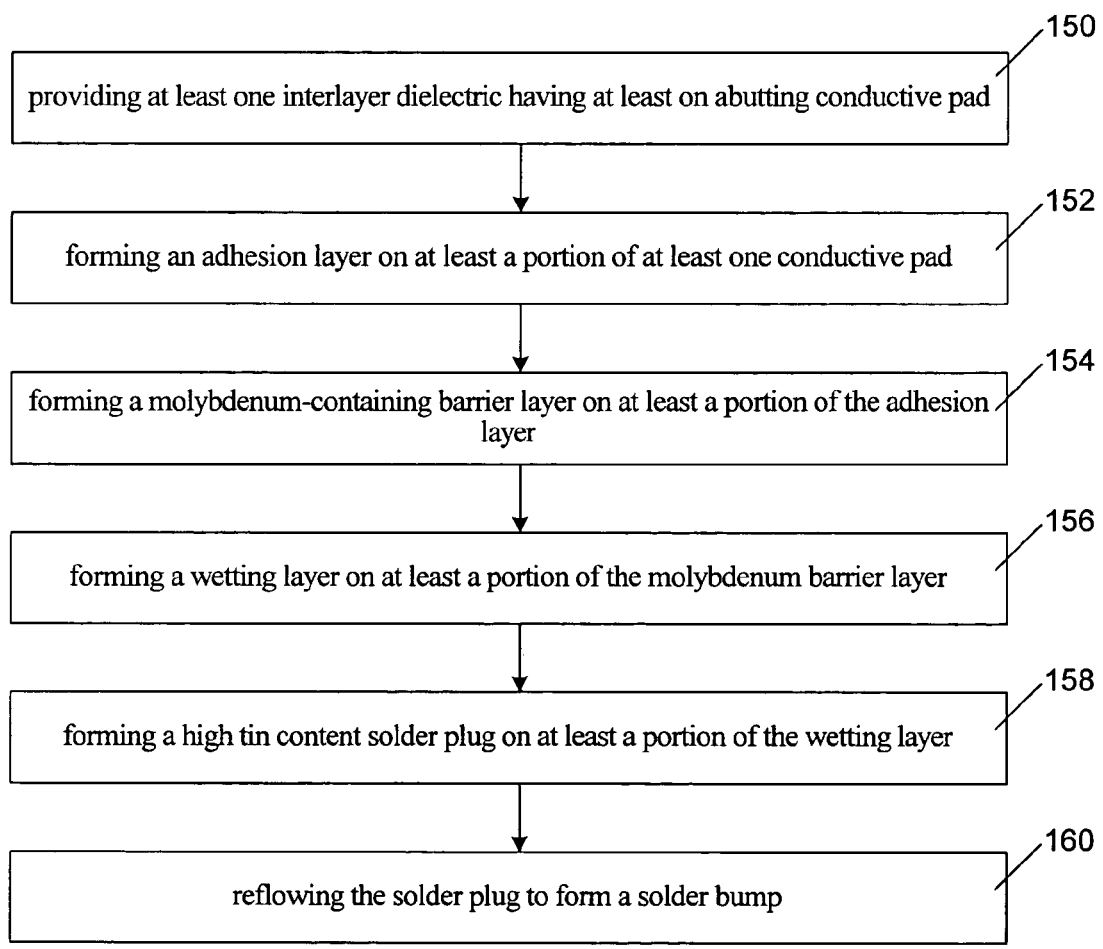
FIG. 4 is a flow diagram of a process for fabricating an under bump metallization and a solder on a microelectronic die, according to the present invention.

FIG. 4 illustrate a schematic of a method of fabricating a metallization layer and a solder bump. Step 150 comprises providing at least one interlayer dielectric having at least one abutting conductive pad. Step 152 comprises forming an adhesion layer on at least a portion of at least one conductive pad. Step 154 comprises forming a molybdenum-containing barrier layer on at least a portion of the adhesion layer. Step 156 comprises forming a wetting layer on at least a portion of the molybdenum-containing barrier layer. The adhesion layer, the barrier layer, and the wetting layer may be formed by any technique know in the art, including but not limited to magnetron sputtering (preferred), evaporation, deposition (such as ion beam deposition), and the like. Step 158 comprises forming a high tin content solder plug on at least a portion of the wetting layer. The solder plug may be formed in any manner known in the art, including but not limited to, electroplating or screen printing. Step 160 comprises reflowing the solder plug to form a solder bump.

Figure 5:
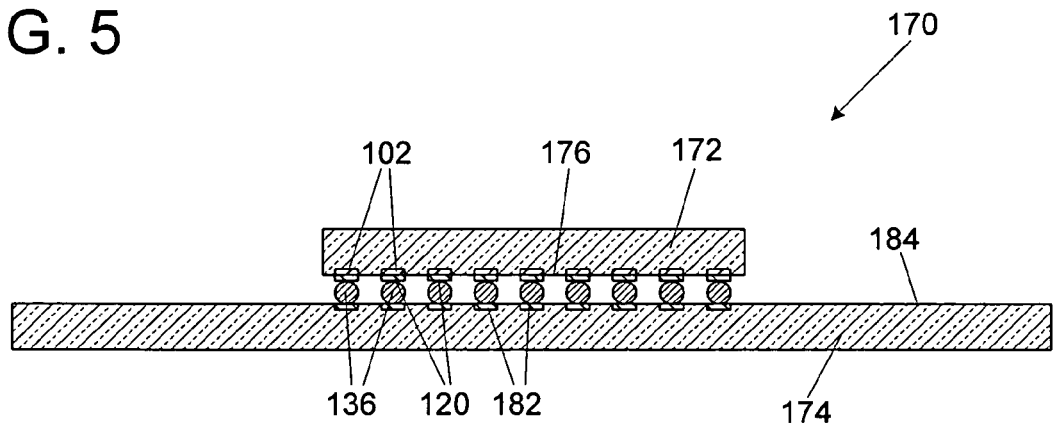
FIG. 5 is a side view of a microelectronic die attached to a substrate, according to the present invention.

FIG. 5 illustrates an exemplary microelectronic package 170 according to the present invention, which includes a microelectronic die 172 that is mounted on a substrate 174, such as an interposer, a motherboard, and the like, which functionally connects the microelectronic die 172 through a hierarchy of electrically conductive paths (not shown) to the other electronic components (not shown). The conductive pads 102 on an active surface 176 of the microelectronic die 172 has the under bump metallization layers 120 disposed thereon, as previously discussed. The under bump metallization layers 120 are attached directly to corresponding lands 182 on a surface 184 of the substrate 174 using solder bumps 136, which are reflowed to form the attachment therebetween.

Figure 6:
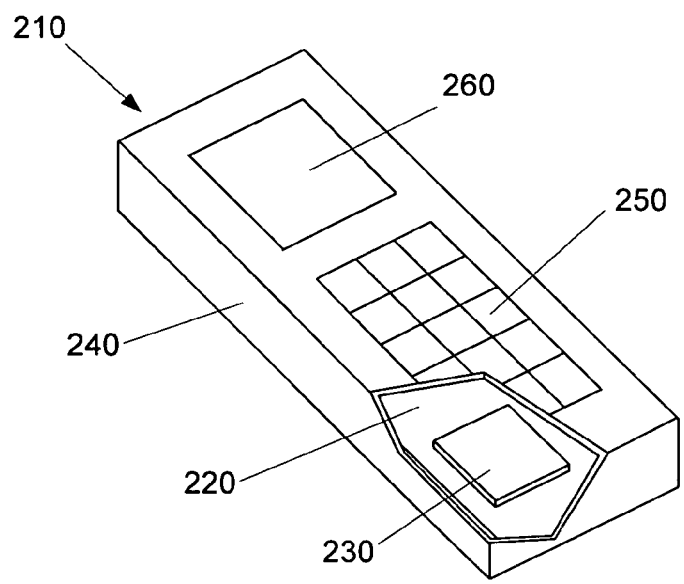
FIG. 6 is an oblique view of a hand-held device having a microelectronic assembly of the present integrated therein, according to the present invention.

The packages formed by the present invention may be used in a hand-held device 210, such as a cell phone or a personal data assistant (PDA), as shown in FIG. 6. The hand-held device 210 may comprise an external substrate 220 with at least one microelectronic device assembly 230, including but not limited to, a central processing units (CPUs), chipsets, memory devices, ASICs, and the like, having at least one under bump metallization layer 120 as described above, within a housing 240. The external substrate 220 may be attached to various peripheral devices including an input device, such as keypad 250, and a display device, such an LCD display 260.

Figure 7:
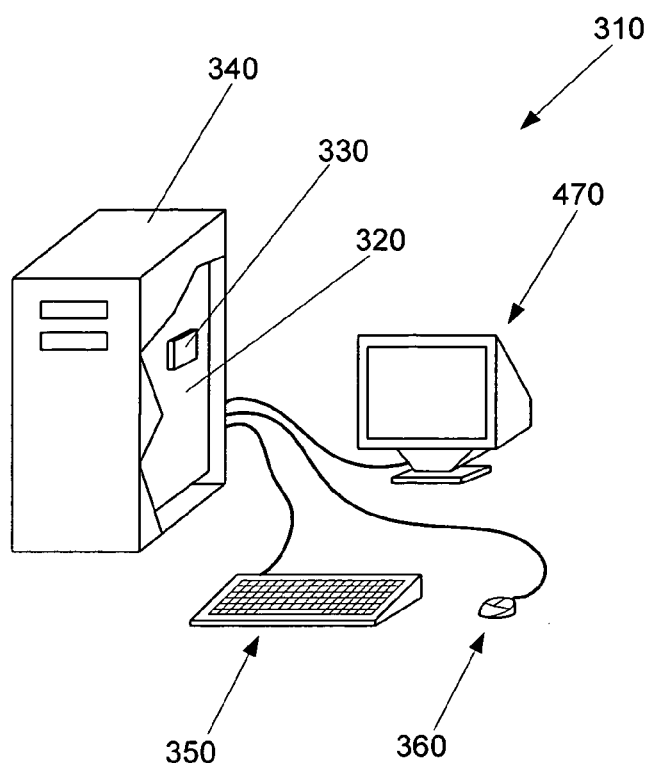
FIG. 7 is an oblique view of a computer system having a microelectronic assembly of the present integrated therein, according to the present invention.
Figure 8:
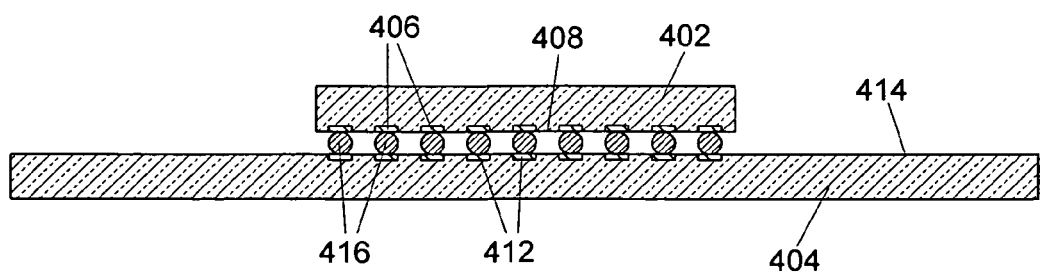
FIG. 8 is a side view of a microelectronic die attached to a substrate, as know in the art.

The microelectronic device assemblies formed by the present invention may also be used in a computer system 310, as shown in FIG. 7. The computer system 310 may comprise an external substrate or motherboard 320 with at least one microelectronic device assembly 330, including but not limited to, a central processing units (CPUs), chipsets, memory devices, ASICs, and the like, having at least one under bump metallization layer 120 as described above, within a housing or chassis 340. The external substrate or motherboard 320 may be attached to various peripheral devices including inputs devices, such as a keyboard 350 and/or a mouse 360, and a display device, such as a CRT monitor 370.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An apparatus, comprising:
    an adhesion layer abutting a conductive pad;
    a molybdenum-containing barrier layer abutting said adhesion layer;
    a wetting layer abutting said molybdenum-containing barrier layer; and
    high tin content solder material abutting said wetting layer, said high tin content solder material having a least about 75% tin by weight.

2. The apparatus of claim 1, wherein said molybdenum-containing barrier layer comprises a material containing at least about 90% (atomic) molybdenum.

3. The apparatus of claim 1, wherein said high tin content solder material comprises a material containing at least about 90% (by weight) tin.

4. The apparatus of claim 1, further comprising said conductive pad abutting at least one layer of low k dielectric material.

5. The apparatus of claim 4, wherein said at least one layer of low-k dielectric material comprises at least one layer of carbon doped oxide.

6. The apparatus of claim 1, wherein said wetting layer is substantially subsumed in said high tin content solder material forming an intermetallic compound layer.

\* \* \* \* \*